United States Patent
Kelber et al.

(10) Patent No.: US 9,564,579 B2
(45) Date of Patent: Feb. 7, 2017

(54) GRAPHENE MAGNETIC TUNNEL JUNCTION SPIN FILTERS AND METHODS OF MAKING

(75) Inventors: Jeffry Kelber, Denton, TX (US); Mi Zhou, Denton, TX (US)

(73) Assignee: UNIVERSITY OF NORTH TEXAS, Denton, TX (US)

( * ) Notice: Subject to any disclaimer, the term of this patent is extended or adjusted under 35 U.S.C. 154(b) by 0 days.

(21) Appl. No.: 14/115,105

(22) PCT Filed: May 25, 2012

(86) PCT No.: PCT/US2012/039487
§ 371 (c)(1),
(2), (4) Date: Feb. 20, 2014

(87) PCT Pub. No.: WO2012/166562
PCT Pub. Date: Dec. 6, 2012

(65) Prior Publication Data
US 2014/0151826 A1    Jun. 5, 2014

Related U.S. Application Data

(60) Provisional application No. 61/490,650, filed on May 27, 2011.

(51) Int. Cl.
| | | |
|---|---|---|
| H01L 21/02 | (2006.01) |
| H01L 43/08 | (2006.01) |
| H01L 43/10 | (2006.01) |
| H01L 43/12 | (2006.01) |
| C01B 31/04 | (2006.01) |
| H01L 27/22 | (2006.01) |

(52) U.S. Cl.
CPC .......... *H01L 43/08* (2013.01); *C01B 31/0446* (2013.01); *H01L 21/0237* (2013.01); *H01L 43/10* (2013.01); *H01L 43/12* (2013.01); *C01B 2204/04* (2013.01); *H01L 27/222* (2013.01)

(58) Field of Classification Search
CPC ........................................................ H01L 27/222
See application file for complete search history.

(56) References Cited

U.S. PATENT DOCUMENTS

| | | | | |
|---|---|---|---|---|
| 5,930,164 A | * | 7/1999 | Zhu | ............................. 365/158 |
| 6,791,806 B1 | * | 9/2004 | Gao | ...................... B82Y 10/00 |
| | | | | 360/324.2 |

(Continued)

OTHER PUBLICATIONS

Karpan, et al., "Theoretical Prediction of Perfect Spin Filtering at Interfaces Between Close-Packed Surfaces of Ni or Co and Graphite or Graphene", Physical Review B 78, 195419 (2008).

*Primary Examiner* — Eugene Lee
(74) *Attorney, Agent, or Firm* — Steven B. Kelber

(57) ABSTRACT

A Tunnel Magnetic Junction of high magnetoresistance is prepared at temperatures and pressure consistent with Si CMOS fabrication and operation. A first metal layer of cobalt or nickel is grown on an interconnect or conductive array line of e.g., copper. The metal layer is formed by electron beam irradiation. Annealing at UHV at temperatures below 700K yields a carbon segregation that forms a few layer thick (average density 3.5 ML) graphene film on the metal layer. Formation of a second layer of metal on top of the graphene barrier layer yields a high performance MTJ.

5 Claims, 5 Drawing Sheets

(56) References Cited

U.S. PATENT DOCUMENTS

| | | |
|---|---|---|
| 7,985,579 B2 | 7/2011 | Cecchi |
| 8,350,347 B2* | 1/2013 | Gaudin et al. ............... 257/421 |
| 8,416,618 B2* | 4/2013 | Gaudin et al. ............... 365/171 |
| 8,797,060 B2* | 8/2014 | Nakamura et al. ............ 326/35 |
| 8,802,451 B2* | 8/2014 | Malmhall et al. ............... 438/3 |
| 2002/0000597 A1* | 1/2002 | Okazawa ..................... 257/298 |
| 2009/0321860 A1* | 12/2009 | Klostermann et al. ....... 257/421 |
| 2009/0322319 A1* | 12/2009 | Kreupl .................. B82Y 10/00 324/207.21 |
| 2010/0109712 A1* | 5/2010 | Zaliznyak et al. ............ 327/100 |
| 2011/0102068 A1* | 5/2011 | Bouchiat et al. ............. 327/527 |
| 2011/0149670 A1* | 6/2011 | Heo ......................... B32B 9/00 365/225.5 |
| 2011/0175603 A1* | 7/2011 | Burtman et al. ............... 324/244 |
| 2012/0068281 A1* | 3/2012 | Saida et al. .................. 257/421 |

\* cited by examiner

GRAPHENE MAGNETIC TUNNEL JUNCTION SPIN FILTERS AND METHODS OF MAKING

PRIORITY DATA AND INCORPORATION BY REFERENCE

This application is a National Stage entry under 35 U.S.C. 371 of PCT/US2012/039487, filed on May 25, 2012, which claims priority to U.S. Provisional Patent Application Ser. No. 61/490,650, filed May 27, 2011, the entireties of which are hereby incorporated by reference.

FIELD OF THE INVENTION

The present invention relates to methods of forming a few molecule thick (1-3 or 4 monolayer) graphene layer on a ferromagnetic layer, at temperatures and conditions consistent with integration with silicon-based complementary metal oxide semiconductors (Si CMOS). Specifically, this invention permits for the first time the manufacture of magnetic tunnel junction spin filters and related devices based on graphene on Si CMOS devices at temperatures and conditions consistent with those preexisting structures.

BACKGROUND OF THE INVENTION

The increasing demand for high density magnetic recording and playback, and requirements for non-volatile memory, have focused attention on magnetic tunnel junctions, and the devices that can be prepared therefrom, such as MRAMs and the like. To date, the most advanced magnetic tunnel junctions are principally made of ferromagnetic sandwiches of thin films of aluminum oxide electron tunneling barriers between a metal which is typically iron, cobalt or nickel. Recently, crystalline magnesium oxide has been proposed as the barrier layer. Different materials are selected to improve the observed tunnel magnetic resistance values. Even with thirty (30) years of intensive investigation, the highest TMR values for the Fe/MgO/Fe are about Two Hundred Forty Percent (240%).

Graphene offers decided advantages for the tunnel barrier in a magnetic tunnel junction. Indeed, magnetic tunnel junctions (FIG. 1) composed of FM/few-layer graphene/FM stacks (FM=ferromagnet, i.e., Co, Ni) have been proposed [1] as "perfect spin" filters. The ability to form such stacks on, e.g., Cu interconnect lines would allow direct integration with Si CMOS, leading to broad new capabilities in non-volatile memory, spin-logic, and defect-tolerant, adaptive computing [2-5]. This in turn requires the ability to form multiple graphene layers on Co substrates, and to do so at temperatures below ~700 K, the thermal stability limit of low-k dielectric materials currently employed in advanced Si CMOS devices.

Graphene growth by CVD or PVD on Co surfaces is well-reported, but is usually carried out at higher temperatures (>1000 K). Ago, et al, [9] reports the growth of ordered multilayer graphene films on Co(111)/alumina films by CVD ($CH_4$ and $H_2$) at >1150 K. Varykhalov and Rader [12] report the growth of epitaxial graphene on Co(0001)/W(110) by CVD of propylene at ~730 K. Graphene films non-uniform in thickness have been grown on polycrystalline Co films by CVD (ethylene) at 1073 K [13]. To date, there has not been a satisfactory report of formation of few-layer graphene films followed by annealing to give operative devices at temperatures below 700 K.

Thus, in a typical magnetoresistive random access memory, an array of parallel first conductive lines is presented on a horizontal plane, and an array of parallel second conductive lines on a second horizontal plane is disposed above the first array in a direction perpendicular to the first array of conductive lines. See, for example, U.S. Pat. No. 7,985,579, the disclosure of which pertaining to the formation of MRAMs is incorporated herein-by-reference. The MTJ element is disposed between the two arrays at each crossover point. This requires a technology that permits formation of the stack, and annealing to operative conditions, at Si CMOS compatible temperatures to be integrated in today's dominant electronic and photonic technologies, particularly communications and computing equipment.

SUMMARY OF THE INVENTION

Deposition of ferromagnetic materials such as cobalt and nickel on copper interconnects on Si CMOS devices has been well established. Applicants now demonstrate that few layer graphene films can be formed directly on cobalt or nickel layers at temperatures and conditions compatible with the requirements of Si CMOS fabrication, to provide MTJ spin filters and related devices, for development of various types of non-volatile memory, by forming a FM layer atop an interconnect (for instance, of copper) and then annealing the deposited metal (preferably cobalt, nickel) to segregate carbon in the metal layer formed. Annealing at ultra-high vacuum of lower than about $10^{-7}$ torr yields a few-layer thick graphene layer on the metal, which can be overlaid with a sandwiching film of metal, all at temperatures and conditions consistent with silicon CMOS fabrication and operation. The resulting sandwich or stack provides an MTJ of superior properties.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION OF THE INVENTION

Procedures and Results

The FM/few layer graphene/FM stack based MTJ of the invention was made by first using electron beam evaporation to deposit ~40 Å of (disordered) cobalt on a Al$_2$O$_3$ (0001) substrate, at a background pressure of ~1×10$^{-8}$ Torr, resulting in some carbon being dissolved in the cobalt film. Annealing of the film to ~600 K in UHV results in the segregation of dissolved carbon to the surface of the cobalt film as it orders to form a Co(111) film with carbon overlayer.

Figure 2:
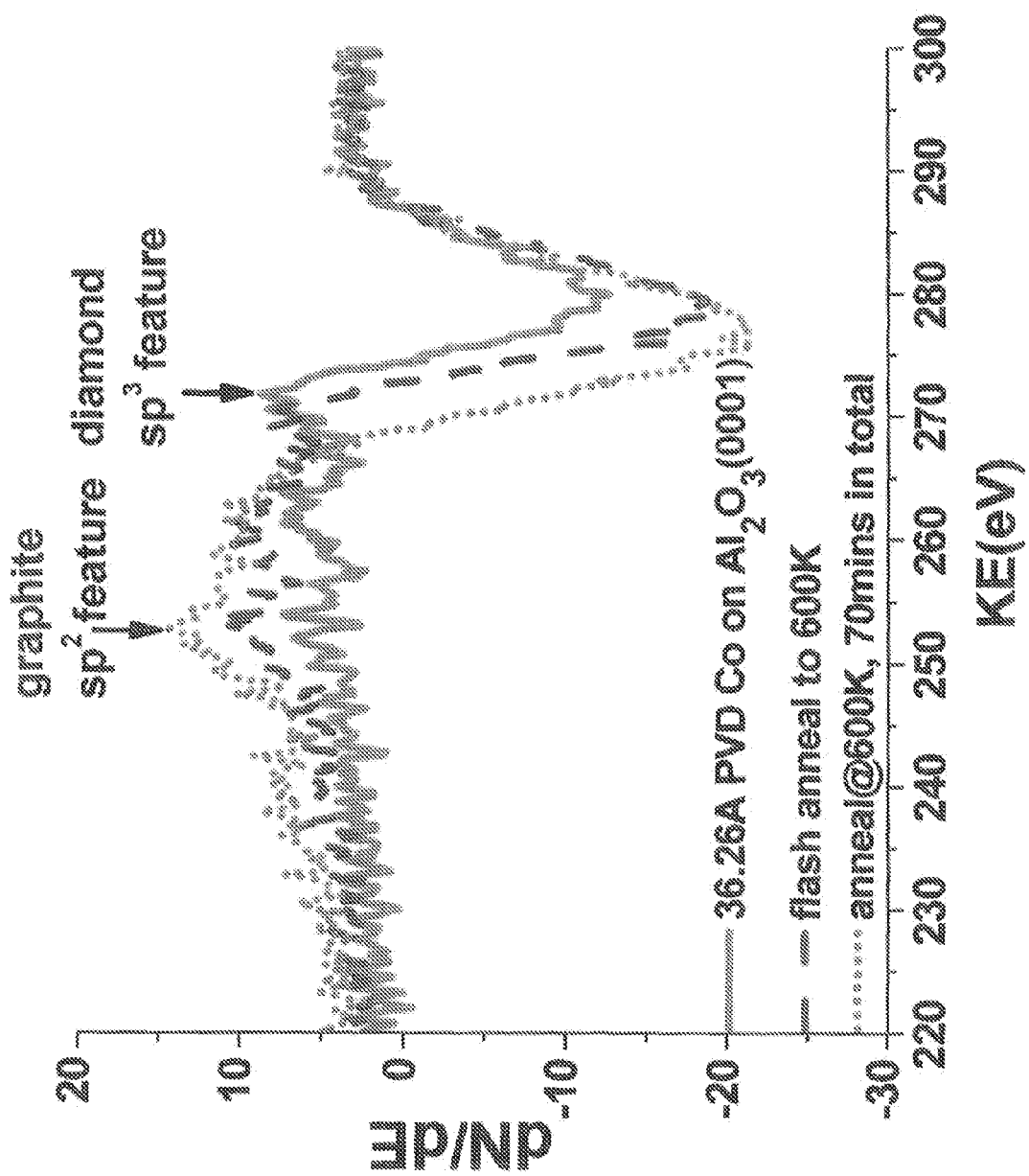
FIG. 2 reflects evolution of C(KVV) Auger lineshape upon annealing a cobalt film of ~40 Å deposited on $Al_2O_3$ (0001). Average graphene layer thickness derived from Auger intensities is ~3.5 monolayers. Annealing conditions: 600 K in UHV, 70 min.

Auger C(KVV) Auger data (FIG. 2) shows that the thickness of the carbon overlayer grows to an average thickness of ~3.5 monolayers during the annealing process, while transforming from sp$^3$ to sp$^2$ carbon chemical bonding—the formation of few layer graphene.

Corresponding LEED data (FIG. 3) obtained from the carbon segregation event demonstrate that the graphene layers are highly ordered, displaying well-defined diffraction spots at 30° relative to the Co diffraction spots. The Auger data (FIG. 2) also show an absence of carbide formation, indicating a chemically abrupt Co/carbon interface which does not disrupt the graphene π network, and which should not depolarize the Co surface layer via oxidation [6]. Indeed, the presence of a uniform graphene layer has been demonstrated to inhibit oxidation of transition metal surfaces even upon ambient exposure [7-10] and can be an important factor in device processing under industrial conditions.

Following annealing, a similar cobalt layer is deposited over the graphene to a thickness of approximately forty (40) angstroms, giving a high performance MTJ which is readily incorporated in an MRAM or other non-volatile memory device, during fabrication. Thus, at desired locations (crossover points) in the underlying array of contact lines, the cobalt or nickel or similar layer (other metals, such as iron, gadolinium (Gd), and neodymium (Nd) are potentially applicable, but less favored) is deposited by electron beam evaporation, and then annealed below 700 K. Following formation of the graphene intermediate layer, a top or "cap" of cobalt or nickel is applied, and the overlying array of conductive lines is formed—forming the MRAM array as part of initial fabrication.

Impact and Potential Benefits

Figure 1:
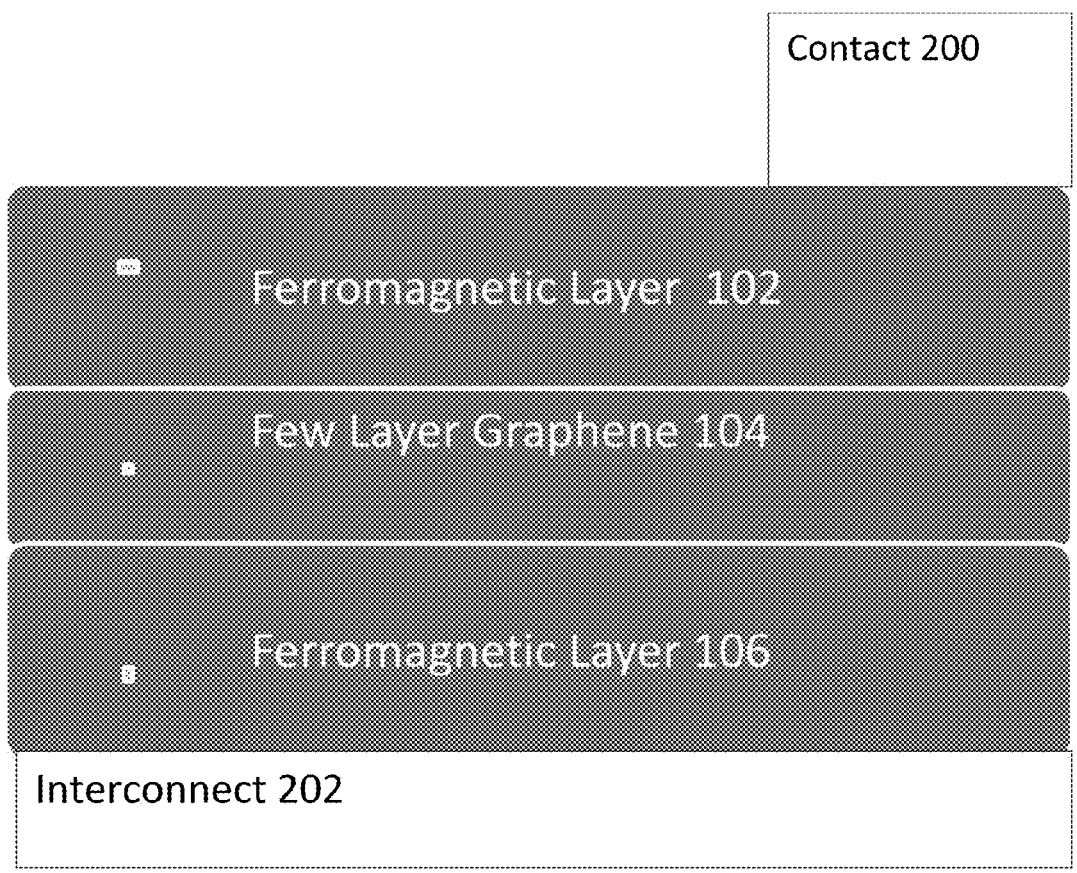
FIG. 1 is a schematic of an MTJ device of the invention. Ferromagnetic layer 106 is formed in electrical contact with interconnect 202, which is in electrical contact with a Si-CMOS device. A few monolayer graphene film 104 is formed atop ferromagnetic layer 106. Ferromagnetic layer 102 is formed on the graphene film opposite ferromagnetic layer 106. An electrical contact 200 is provided on ferromagnetic layer 102. Orientation of the two ferromagnetic layers parallel (P) or antiparallel (AP) results in corresponding tunneling conductances as shown herein. TMR=($[G_P - G_{AP}]/G_{AP} \times 100\%$.

The completion of a Co/3.5 monolayer graphene/Co junction via the deposition of a Co layer on few layer graphene, as per FIG. 1, would have a predicted [1] spin filtering effect of ~75-80% (FIG. 1). Tunneling magnetoresistance (TMR) is usually defined [6] as:

$$TMR=(G_P-G_{AP})/G_{AP} \quad (1)$$

Figure 4:
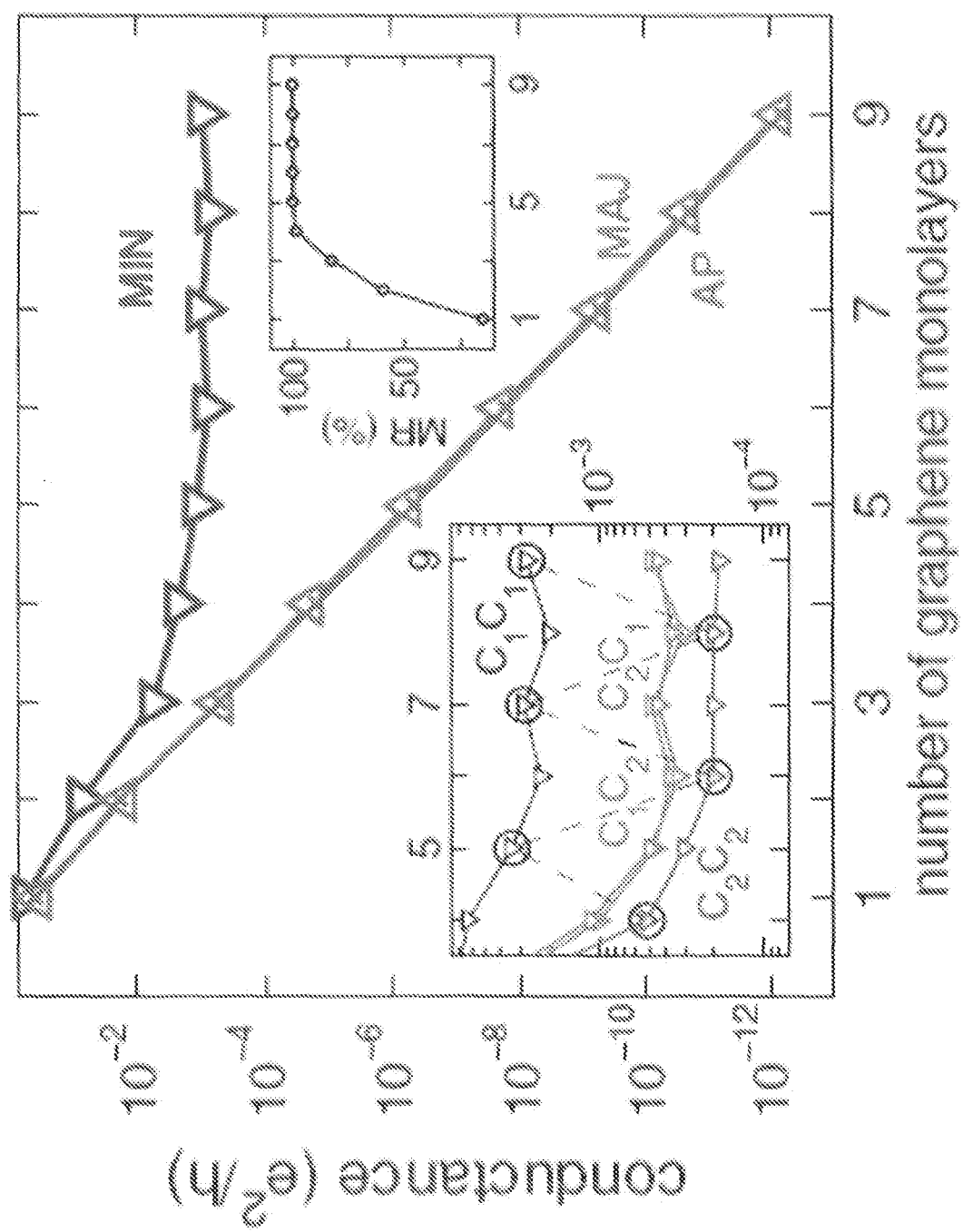
FIG. 4 presents graphically predicted $G_P$ and $G_{AP}$ values for a FM/few layer graphene/FM MTJ as a function of the number of graphene layers, from ref. [1].

This predicted value, as set forth in Karpan et al, is set artificially low. In the calculations set forth in FIG. 4, the denominator is G$_{(parallel)}$ instead of G$_{(antiparallel)}$ as normally done. This was done since, in graphene, G$_{(antiparallel)}$ becomes vanishingly small. Traditional calculations give TMR values well in excess of one thousand percent (1000%) but are difficult to calculate with certainty.

The predicted [1]TMR values for a Co/3.5 monolayer graphene/Co structure are therefore ~10$^3$. Further increases in the number of graphene layers, by enhancing segregation of carbon, longer annealing times, etc. could increase the TMR value to ~10$^{12}$. In contrast, the best reported existing TMR value, obtained for a MTJ based on a Fe alloy/Mg (100)/Fe(100) device[11] is only ~240%. The high TMR values for the Co/graphene/Co device (FIG. 1) allow much larger arrays, smaller devices, and give an on/off ratio approaching or exceeding that of existing Si CMOS devices. Other Potential Benefits Include:

Co(111) films can be formed at room temperature on Cu(111) without Cu—Co alloying. Device formation at temperatures below ~770 K inhibits interfacial diffusion, and a Co fcc→hcp phase transition. This allows for the formation of Co or Ni films on Cu without a diffusion barrier, greatly simplifying processing.

The process set forth above is self-developing and self-aligning: graphene films grow only where Co has been deposited, thus eliminating the need for graphene patterning to form device structures.

FM/graphene/FM MTJ's are predicted [1] to be highly tolerant of disorder to interfacial structure. Accordingly it is possible to form MTJ structures of this type on polycrystalline Cu interconnect lines using polycrystalline Co, thus allowing such devices to be made directly with current processing methods.

Comparison with Prior Art

Figure 3:
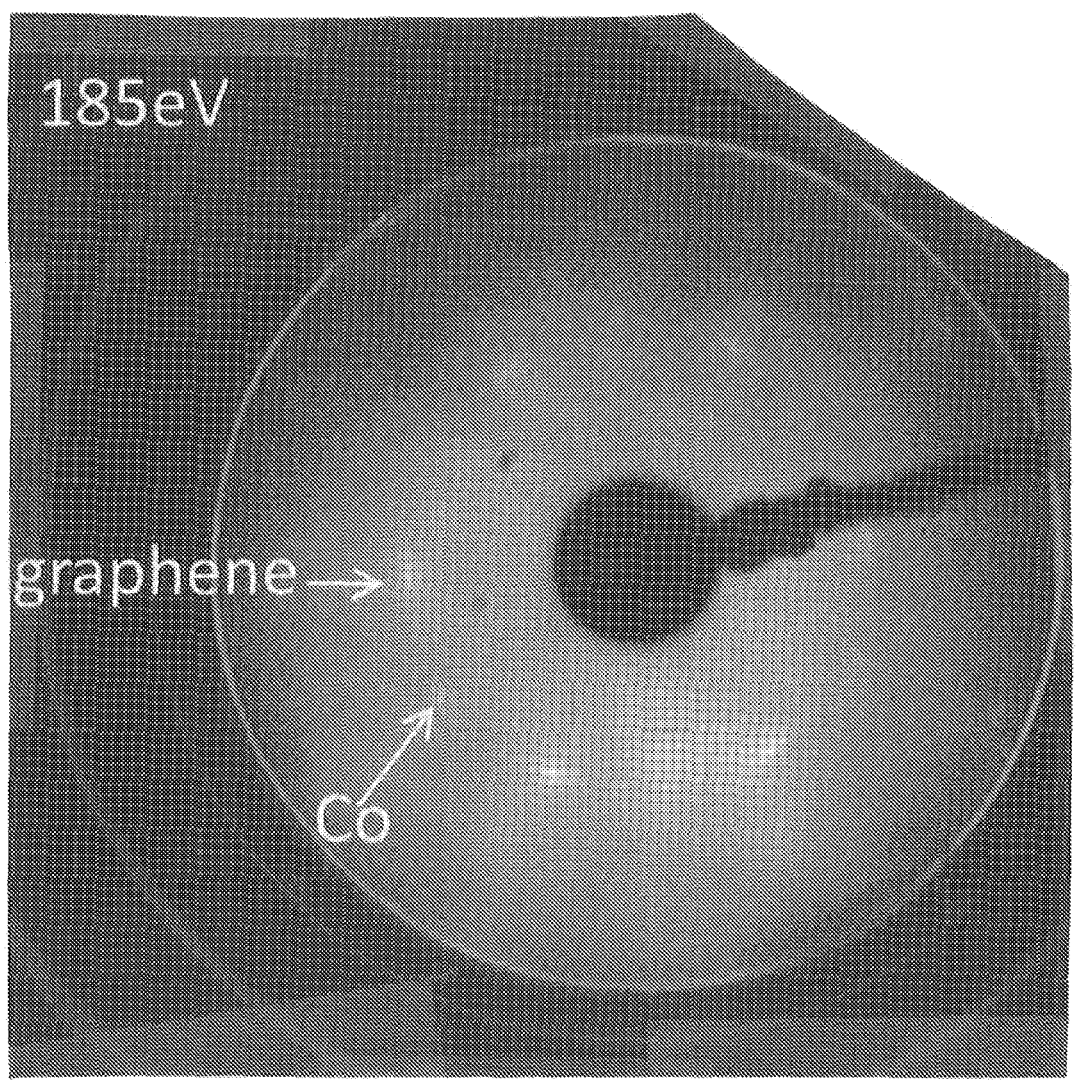
FIG. 3 reflects corresponding LEED image data showing a graphene lattice in an R30 position relative to Co. The relatively narrow nature of the graphene spots indicates a high degree of azimuthal ordering of the graphene layers.
Figure 5:
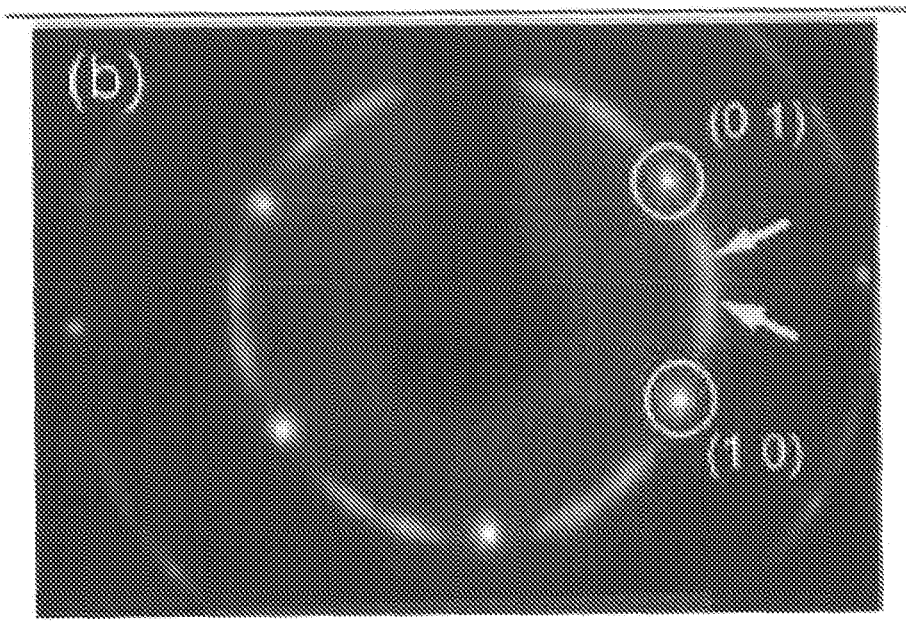
FIG. 5 is a LEED image of few-layer graphene on ordered Co film grown by CVD (CH$_4$+H$_2$) at ~1200 K. Note the streaky nature of graphene spots corresponding to the graphene lattice, indicative of azimuthal randomization. This figure is a reference figure taken from ref. [9].

The relative ordering of multilayer graphene films from the above-described process appears high (FIG. 3). In contrast, films grown by AgO, et al. [9] appear to be azimuthally disordered (FIG. 5) as evidenced by the appearance of streaks, rather than spots, corresponding to the graphene lattice. Loss of optimum MTJ performance parameters aside, the processing temperatures involved for these and other graphene films formed by CVD (>750 K) pose significant problems for integration with Si CMOS at the interconnect or packaging levels. Applicant's invention permits the direct fabrication of MTJ's in Si CMOS devices using conventional technology, operating at high performance at ambient conditions.

REFERENCES

[1] V. M. Karpan, P. A. Khomyakov, A. A. Starikov, G. Giovannetti, M. Zwierzycki, M. Talannana, G. Brocks, J. van den Brink, P. J. Kelly, Phys. Rev. B. 78 (2008) 195419.

[2] R. Richter, L. Bar, J. Wecker, G. Reikss, Appl. Phys. Lett. 80 (2002) 1291.

[3] R. Richter, H. Boeve, L. Bar, J. Bangert, G. Rupp, G. Reiss, J. Wecker, Solid State Electronics 46 (2002) 639.

[4] J. R. Heath, P. J. Kuekes, G. S. Snider, R. S. Williams, Science 280 (1998) 1716.

[5] W. C. Black Jr. and B. Das, J. Appl. Phys. 87 (2000) 6674.

[6] J. P. Velev, P. A. Dowben, E. Y. Tsymbal, S. J. Jenkins, A. N. Caruso, Surf. Sci. Rept. 63 (2008) 400.

[7] Y. S. Dedkov, M. Fonin, U. Rudiger, C. Laubschat, Phys. Rev. Lett. 100 (2008) 107602.

[8] M. Weser, Y. Rehder, K. Horn, M. Sicot, M. Fonin, A. B. Preobrajenski, E. N. Voloshina, E. Goering, Y. S. Dedkov, Appl. Phys. Lett. 96 (2010) 012504.

[9] H. Ago, Y. Ito, N. Mizuta, K. Yoshida, B. Hu, C. M. Orofeo, M. Tsuji, K. Ikeda, S. Mizuno, ACS Nano 4 (2010) 7407.

[10] L. Kong, C. Bjelkevig, S. Gaddam, M. Zhou, Y. H. Lee, G. H. Han, H. K. Jeong, N. Wu, Z. Zhang, J. Xiao, P. A. Dowben, J. A. Kelber, J. Phys. Chem. C. 114 (2010) 21618.

[11] F. Bonell, S. Andrieu, F. Bertran, P. Lefever, A. T. Ibrahimi, E. Snoeck, C. Tiusan, F. Montaigne, IEEE Trans. Mag. 45 (2009) 3467.

[12] A. Varykhalov and O. Rader, Phys. Rev. B. 80 (2009) 035437.

While the current invention has been disclosed with references to certain embodiments, numerous modification, alterations, and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A magnetic tunnel junction (MTJ) of high tunneling magnetoresistance (TMR) in excess of 250%, comprising a first ferromagnetic metal layer, a few molecule layer film of graphene on said first ferromagnetic metal layer, and a second ferromagnetic metal layer on said graphene film.

2. The MTJ of claim 1, wherein said TMR value is in excess of 1,000%, and said first and second ferromagnetic metal layers are comprised of cobalt or nickel.

3. The MTJ of claim 1, wherein said MTJ is formed on a conductive interconnect of a Si CMOS device.

4. The MTJ of claim 1, wherein said first and second ferromagnetic metal layers are in parallel ferromagnetic orientation with respect to each other.

5. The MTJ of claim 1, wherein said first and second ferromagnetic metal layers are in antiparallel ferromagnetic orientation with respect to each other.

* * * * *